United States Patent [19]

Duffield

[11] Patent Number: 4,744,006
[45] Date of Patent: May 10, 1988

[54] APPARATUS FOR EXPANDING THE INPUT/OUTPUT CAPABILITIES OF A PERSONAL COMPUTER

[76] Inventor: Robert H. Duffield, 5742 Honors Dr., San Diego, Calif. 92122

[21] Appl. No.: 884,185

[22] Filed: Jul. 10, 1986

[51] Int. Cl.⁴ .............................................. H01R 23/68
[52] U.S. Cl. .................................... 361/413; 361/397; 361/414; 361/424; 439/61
[58] Field of Search ............... 361/413, 414, 424, 399; 339/17 R, 17 M, 17 B

[56] References Cited

U.S. PATENT DOCUMENTS

| | | | |
|---|---|---|---|
| 4,203,148 | 5/1980 | McComas | 361/399 |
| 4,525,802 | 6/1985 | Hackamack | 361/399 |
| 4,683,550 | 7/1987 | Jindrick et al. | 361/413 |

FOREIGN PATENT DOCUMENTS 0090539  10/1983  European Pat. Off. ............ 361/424

OTHER PUBLICATIONS

Dual-Plane Printed Circuit Card Support, R. J. Flaherty & R. O. Norton, IBM Technical Disclosure Bulletin, vol. 15, No. 5, Oct. 1972.

Primary Examiner—Robert S. Macon
Attorney, Agent, or Firm—Knobbe, Martens, Olson & Bear

[57] ABSTRACT

An expansion card for a personal computer includes a printed circuit board having a portion that extends through an opening in the computer so that input/output connectors can be mounted on the extended portion. The number of input/output connectors that can be mounted on the extended portion of the printed circuit board is greater than the number of connectors that can be mounted on a conventional expansion card for a personal computer. The expansion card includes an enclosure that surrounds the extended portion of the printed circuit board to provide mechanical support for the connectors mounted thereon and further to provide shielding to substantially prevent the emission of electromagnetic radiation from the extended portion. The enclosure includes a portion that extends through the opening in the personal computer so that the enclosure can be securely attached to the personal computer by a support member which also blocks electromagnetic emissions through the opening. The expansion card is electrically connected to a female expansion slot connector in the personal computer by an offset connector so that the printed circuit board can be positioned in the center of the opening.

27 Claims, 7 Drawing Sheets

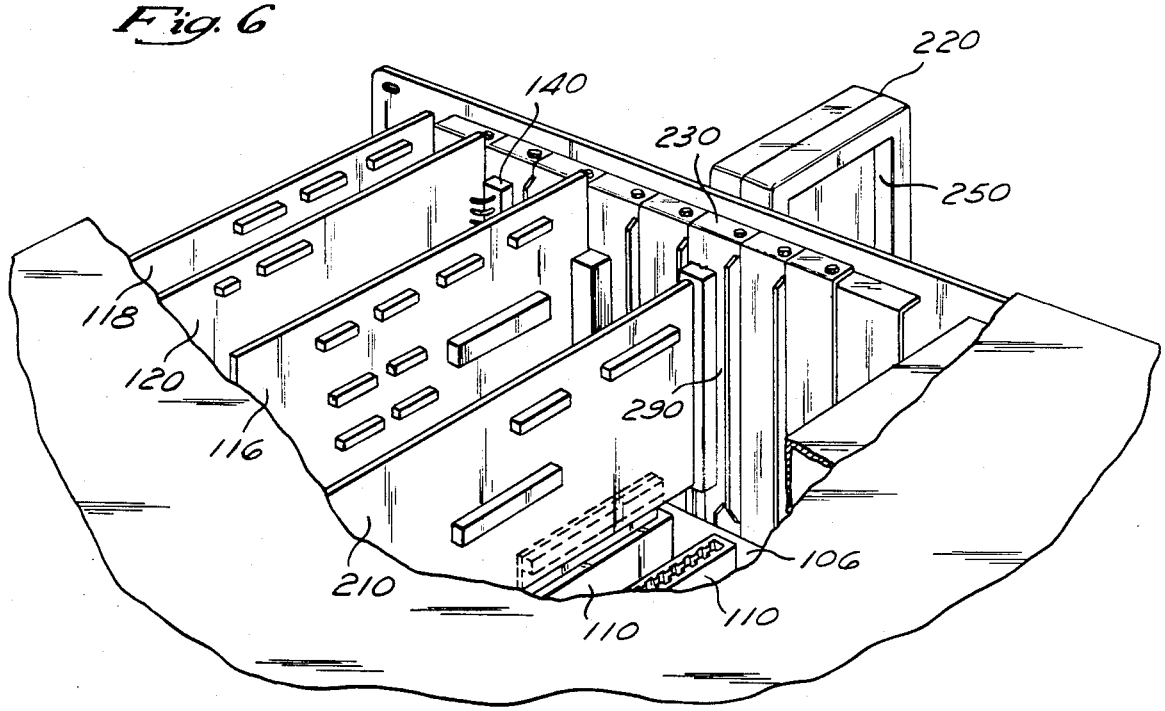
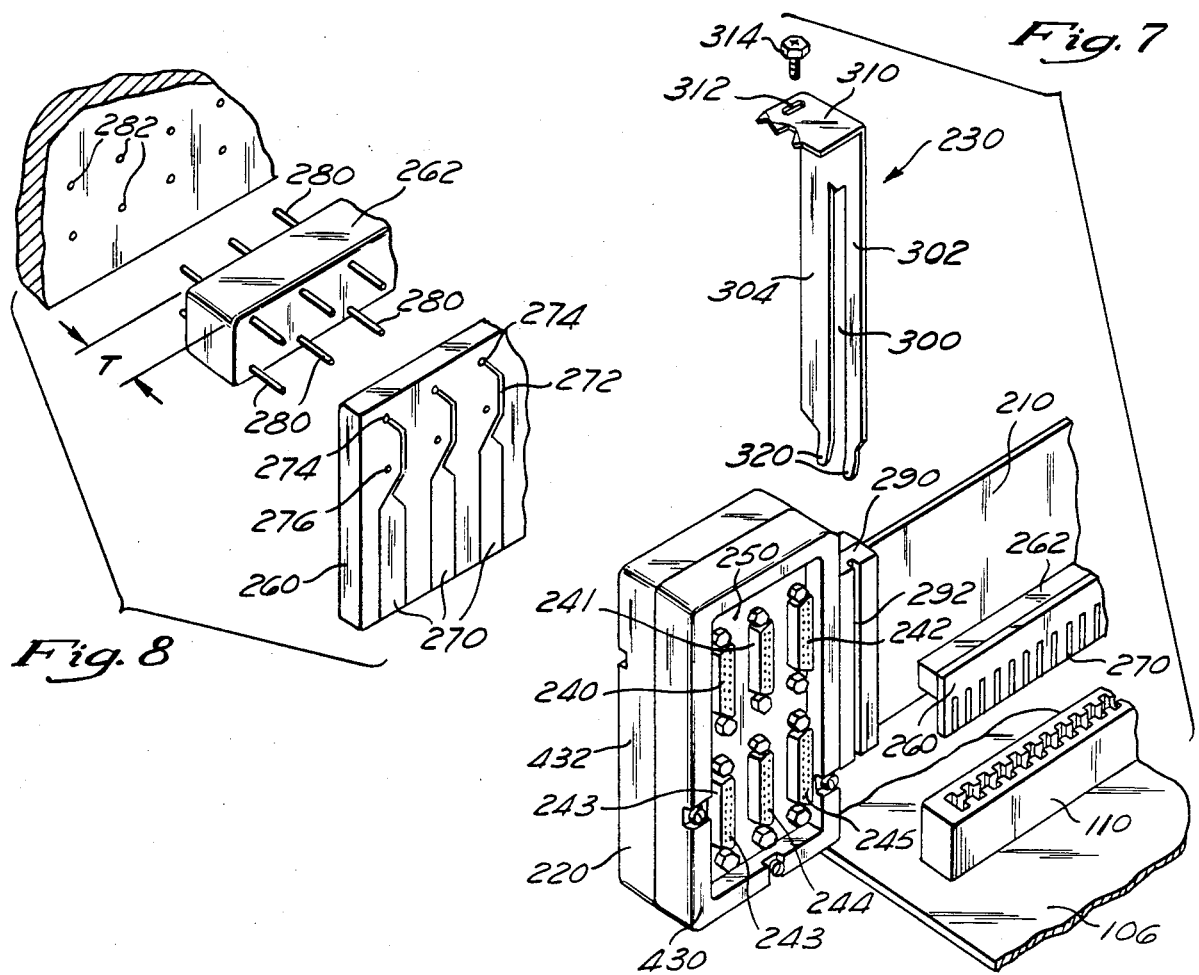

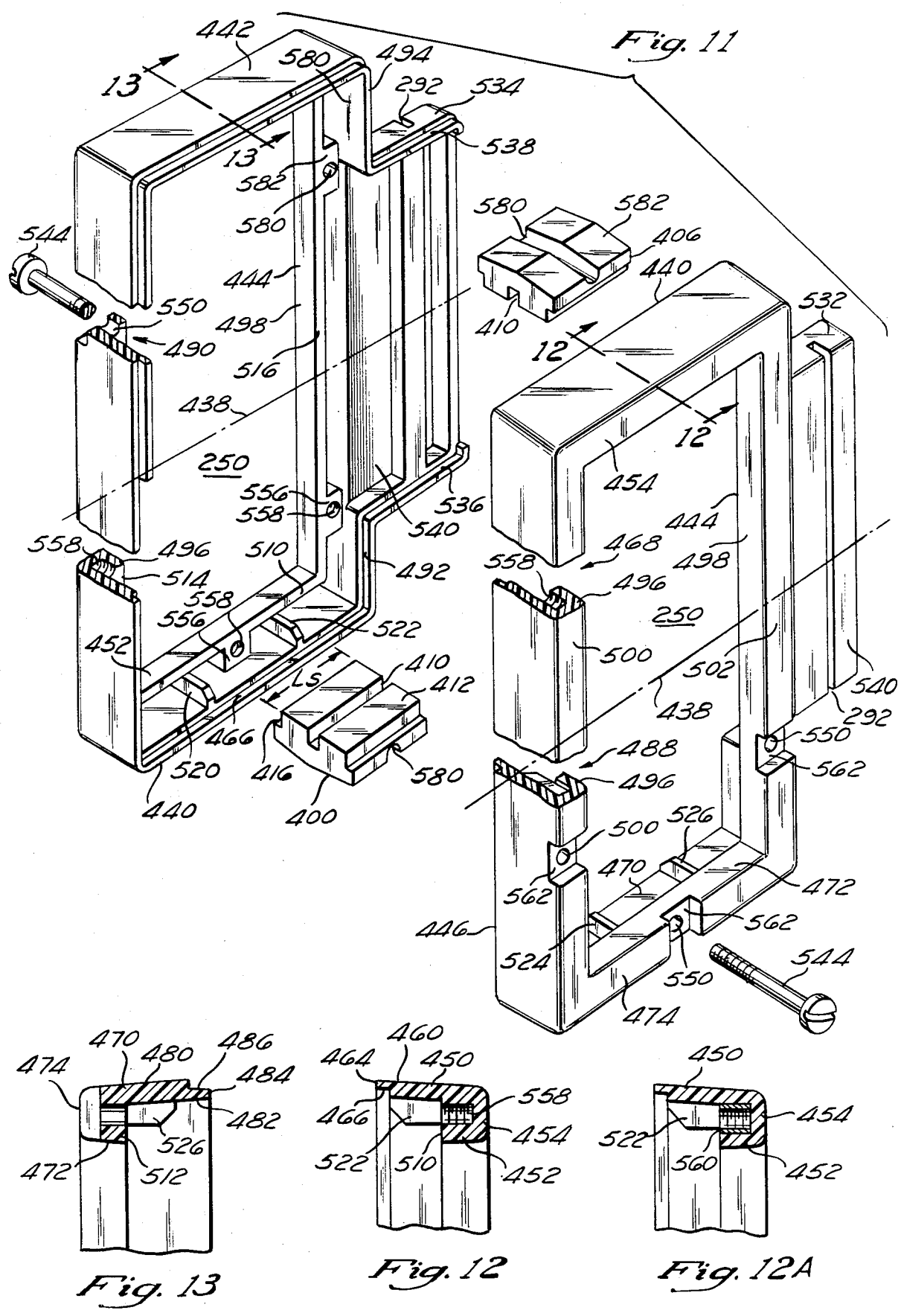

APPARATUS FOR EXPANDING THE INPUT/OUTPUT CAPABILITIES OF A PERSONAL COMPUTER

BACKGROUND OF THE INVENTION

The present invention relates to personal computers, and more particularly, relates to expansion boards used to increase the capabilities of such personal computers.

The IBM ® personal computer and its many imitators and competitors have spawned an entire industry geared to the production of equipment to expand the capabilities of personal computers. For example, a typical personal computer, such as those manufactured by IBM ®, is manufactured with a system board (sometimes called a motherboard) that includes the digital electronics to provide the basic processing requirements of the computer. The system board typically has a number of female connectors electrically connected to a common bus on the system board so that additional electronics can be provided to communicate with the electronics on the system board. These female connectors are frequently referred to as expansion slots and are used to receive contacts on the edges of printed circuit boards that are plugged into the connectors. In an exemplary personal computer, one expansion slot is used to accommodate a printed circuit board containing digital electronics to control a video display unit, such as a color monitor, or the like. An additional printed circuit board provides a controller for floppy disk drives and/or hard disk drives. Other expansion slots may be used, for example, for printed circuit boards that provide serial interface or parallel interface capability for driving a printer, or the like.

Typically, one end of a printed circuit board that has been plugged into an expansion slot is positioned proximate to the metallic frame of the personal computer. This positioning of the printed circuit card allows the printed circuit card to be structurally connected to the frame of the computer for stability. Furthermore, if the printed circuit card is used to provide input/output capabilities for the computer, an external connector is typically electrically and mechanically connected to the printed circuit card and protrudes through a rectangular opening in the frame of the computer proximate to the end of the card. Thus, an external device, for example, a printer, can be plugged into the external connector to provide electrical interconnection between the external device and the printed circuit card. An exemplary computer typically has a rectangular opening in the frame for each expansion slot.

The metallic frame of the personal computer also provides electromagnetic shielding for the personal computer so that electromagnetic noise generated by rapidly switching signals in the personal computer are not radiated from the computer. The rectangular openings in the frame typically are each approximately 4 inches in height by ½ inch in width. Each opening is blocked by a cover that is removed when an expansion card is added to the computer. Since the opening in the frame would permit the emission of radiated electromagnetic energy when a printed circuit card having an external connector is added to an expansion slot, any portion of the opening in the frame not occupied by the connector is covered with a metallic or other electromagnetic shielding material to maintain the integrity of the electromagnetic shielding of the computer.

An exemplary personal computer may have five or more expansion slots. (For example, the IBM Personal Computer XT has eight expansion slots.) In many cases, an expansion slot is required to accommodate the video controller, another expansion slot is required to accommodate the disk controller, another expansion slot accommodates a parallel printer interface, another expansion slot accommodates a serial interface, and another expansion slot accommodates a modem. Other possible combinations of printed circuit boards can of course be accommodated. Irrespective of the combination of expansion boards selected, it is clear that only a limited number of boards can be accommodated at any one time. Although the number of expansion slots has been found to be adequate for many purposes, a number of personal computer users have a need to interconnect a large number of peripheral devices. For example, a user may have a letter quality printer to provide correspondence, a dot-matrix printer to provide drafts of letters and documents, a plotter to provide drawings, and a mouse, or the like, to provide an additional input means as an alternative to the keyboard. Thus, one skilled in the art can readily see that the reasonable needs of some computer users cannot be met with the number of expansion slots available in a typical personal computer.

A typical response to that need has been to combine functions on an expansion card and to provide additional connectors on each expansion card so that more than one peripheral device can be connected to that expansion card. Thus, the number of expansion cards needed can be reduced. For example, expansion cards are available that combine a modem and a serial port, and cards are available that provide a parallel port and a video port, and other combinations. However, the number of combinations that can be provided is limited by the size of the opening in the frame of the personal computer. For example, it can be readily shown that two of the typical 25-pin serial or parallel connectors and their associated mounting hardware cannot be readily accommodated in the opening in the frame.

In order to respond to the need for more input/output connections, a number of products have been developed that utilize the output connectors that will fit through the opening in the frame. An interconnection cable is connected between the output connectors in the expansion card and a separate expansion box that includes additional connectors to accommodate interconnections to additional peripheral devices. In some products, the expansion boxes are passive devices that include a simple switch to selectively interconnect one of the peripheral devices to the internal card at any one time. Thus, the expansion box does not provide the same capabilities as can be provided if each connector is connected directly to a printed circuit board in the computer. Furthermore, the number of connections that can be accommodated are limited by the number of pins in the output connectors on the expansion card. The number of pins is limited by the area of the opening in the frame, and is typically limited to approximately 50 pins, the number of pins in two connectors or one large connector. Other devices have used large cables to extend the entire system bus to an external chassis. This is a very expensive and impractical solution to the problem of increasing the number of input/output connectors.

SUMMARY OF THE INVENTION

The present invention is an improved apparatus and method for expanding the input/output capabilities of a personal computer by using a single expansion slot of the personal computer to provide input/output communications with a plurality of external devices. The present invention includes a printed circuit card that has a length sufficient to extend through an opening in the frame of the personal computer proximate to a card-edge connector that provides access to the computer bus. a portion of the improved printed circuit card extends outside the case of the computer and accommodates a plurality of electrical connectors that are electrically connected directly to the extended portion of the printed circuit board. The extended portion of the printed circuit board is enclosed in an enclosure that has a metallized surface to provide electromagnetic shielding of the extended portion of the printed circuit board. A portion of the enclosure extends through the opening in the frame of the computer so that the integrity of the electromagnetic shielding is maintained when the apparatus of the present invention is used.

The apparatus of the present invention has the advantage that a plurality of external connectors can be connected to the extended portion of the printed circuit board. The external connectors are connected to the electronic circuitry of the printed circuit board in the computer via printed circuit lines on the portion of the board passing through the opening of the computer. The number of interconnections that can be made to the printed circuit board is many times greater than the number that can be accommodated through the connectors on previously available expansion cards. The shielding of the enclosure around the extended portion of the printed circuit board maintains the integrity of the electromagnetic shielding of the computer and thus substantially reduces or eliminates the possibility of electromagnetic interference that might occur when using a single connector and an external expansion box.

In the preferred embodiment, the enclosure for the extended portion of the printed circuit board is a high impact plateable plastic (for example, ABS) having at least one of the inner surface or the outer surface plated with nickel or other suitable material to provide the electromagnetic shielding. Preferably, the enclosure is a two-piece enclosure which is positioned on both sides of the printed circuit board and then fastened together to fully enclose the extended portion of the printed circuit board. The enclosure has a frame forming an opening to accommodate the electrical connectors. In a preferred embodiment, the frame has a uniform size and shape (e.g., rectangular) which is large enough to accommodate a plurality of the various commonly used connectors so that the enclosure can be readily mass-produced. The connectors to the printed circuit board are surrounded by electromagnetic shielding, such as, for example, a flat blocking plate of steel or other suitable material, that blocks the rectangular opening in the frame when the enclosure is installed on the printed circuit board, thus completing the electromagnetic shielding. The blocking plate has an outside dimension that is selected to be larger than the opening in the frame. Openings are formed in the plate to accommodate the connectors. Therefore, only the plate need be modified to accommodate a different combination of sizes and shapes of connectors to be connected to the printed circuit board. Thus, a single configuration of enclosure can thus accommodate many configurations of connectors. In preferred embodiments, each piece of the two-piece enclosure is identical to the other piece so that the two pieces are interchangeable. Thus, only one injection mold is needed to produce the two pieces.

Preferably, a portion of the enclosure extends through the opening in the computer frame. That portion has a pair of opposed slots with one slot oriented on each of the two sides of the enclosure to receive a metallic support. The metallic support slides into the opposed slots and is fastened to the computer frame by a screw or other fastening means to thereby secure the enclosure, and thus the printed circuit board to the computer. The metallic support together with the enclosure occupies the entire opening in the computer frame to thus block electromagnetic emission through the opening.

In an exemplary personal computer, the female connector that defines the expansion slot is offset from the centerline of the opening in the computer frame. The printed circuit board of the present invention is preferably substantially aligned with the center of the opening, and thus is not aligned with the female connector. The present invention includes an offset connector spaced apart from the printed circuit to interconnect the female connector on the computer system board with contacts on the printed circuit board of the invention.

BRIEF DESCRIPTION OF THE DRAWINGS

FIG. 6 is a partially broken-away perspective veiw of the inside of the personal computer taken along the lines 6—6 in FIG. 5 showing the interconnection between the expansion card of the present invention and the female bus connectors, and further showing the retention of the expansion card by the vertical support member.

FIG. 7 is a partial perspective view of the expansion card of the present invention inserted into the computer prior to engagement of the offset connector with the female bus connector, wherein the computer frame and the expansion card support frame are omitted for clarity.

FIG. 8 is a partial, exploded perspective view of the expansion card of FIG. 7, showing the relationshp between the printed circuit board, the spacer and the offset connector.

FIG. 11 is an enlarged, exploded perspective view of the first and second enclosure halves showing additional details of the structure of the cross members and the vertical members.

FIG. 12 is a partial cross sectional view of the first cross member taken along the lines 12—12 in FIG. 11 showing the J-shaped cross section of the first cross member.

FIG. 12a is a partial cross sectional view of the first cross member taken along the lines 12—12 in FIG. 11 that is similar to the view in FIG. 12 and which shows the use of a threaded insert.

FIG. 13 is a partial cross sectional view of the second cross member taken along the lines 13—13 in FIG. 11 showing the J-shaped cross section of the second cross member.

DETAILED DESCRIPTION OF THE PREFERRED EMBODIMENTS

Figure 1:
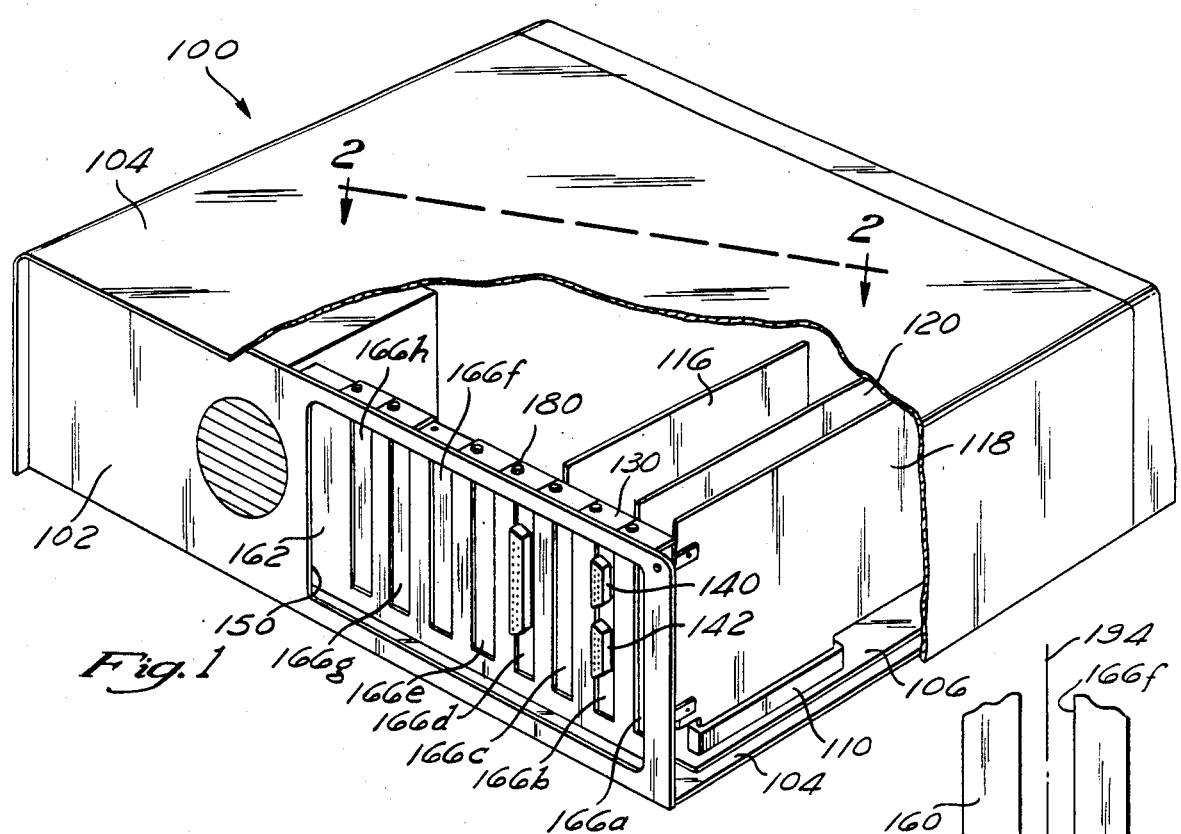
FIG. 1 is a partially broken-away perspective view of an exemplary personal computer showing exemplary expansion cards installed therein.
Figure 2A:
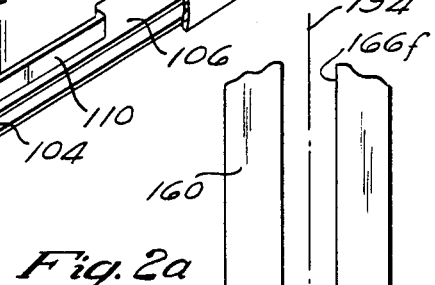
FIG. 2a is an enlarged sectional view of a portion of the inside of the personal computer taken along the lines 2a—2a in FIG. 2 showing the placement of the female bus connectors with respect to the openings in the expansion card support frame.
Figure 2:
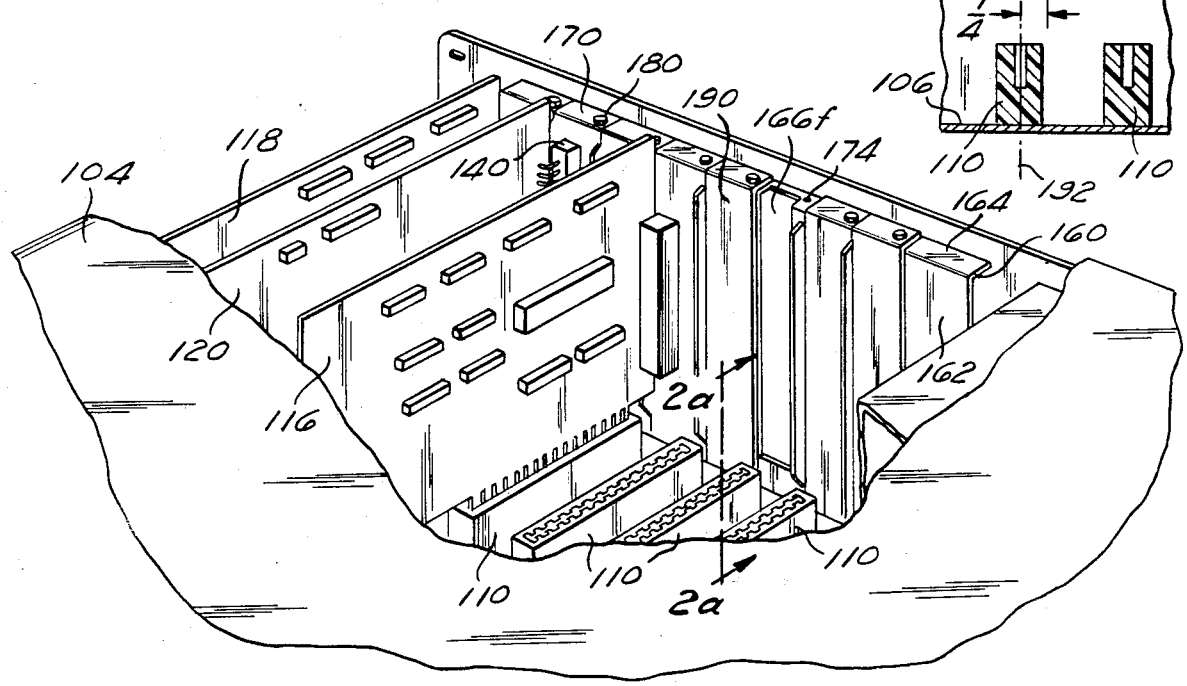
FIG. 2 is a partially broken-away perspective view of the inside of the personal computer taken along the lines 2—2 in FIG. 1 showing the interconnection between an exemplary expansion card and the female bus connectors.

FIGS. 1 and 2 illustrate the rear view of an exemplary personal computer 100, such as the IBM ® personal computer or one of the many compatible computers in the personal computer market. The personal computer 100 includes a frame 102 that supports the electronics within the personal computer. The personal computer 100 also includes an outer cover 104 of metal or metal-plated material that slides over the frame 102 to provide protection for the electronics as well as providing a more pleasing aesthetic appearance for the personal computer 100. As is known in the art, a large portion of the electronics of the personal computer is located on a system board (or motherboard) 106 in the personal computer 100. Typically, the system board 106 is positioned parallel with the bottom surface of the personal computer 100. The system board 106 supports a number of female bus connectors 110 that provide electrical interconnection to an address, data and control bus (system bus) that is part of the system board 106. For example, the IBM Personal Computer XT includes eight female connectors on the system board 106 for providing the interconnections to the bus. Further details regarding the system board 106 and the system bus can be found in the IBM Personal Computer XT Technical Reference Manual available for International Business Machines Corporation or one of its suppliers.

The bus connectors 110 are shown more clearly in FIG. 2, wherein a portion of the cover 104 has been removed to show the inside of the personal computer 100. The bus connectors 110 in the IBM personal computer have two opposed rows of thirty-one contacts and are positioned to receive exemplary expansion cards, such as cards 116, 118 and 120, for example. An exemplary expansion card 120 is shown in more detail in FIG. 3. The expansion card 120 includes a printed circuit board 122 which has electrical circuitry mounted thereon and interconnected by printed circuit wiring (not shown) in a known manner. A lower portion of the printed circuit board 122 has an extended portion 124 to provide support for a plurality of contacts 126 that are used to provide electrical interconnection to the bus connector 110 when the expansion card 120 is inserted in the personal computer 100. Typically, the contacts 126 are formed as part of the etching of the copper on the printed circuit board 122 and are electrically connected via printed circuit lines to the electronics on the printed circuit board 122. If contact is required with each of the sixty-two contacts in the bus connector 110, the extended portion 124 of the printed circuit board 122 will have thirty-one contacts 126 on each side of the printed circuit board 122. The number of contacts 126 used will depend upon the specific application for the expansion card 120.

Figure 3:
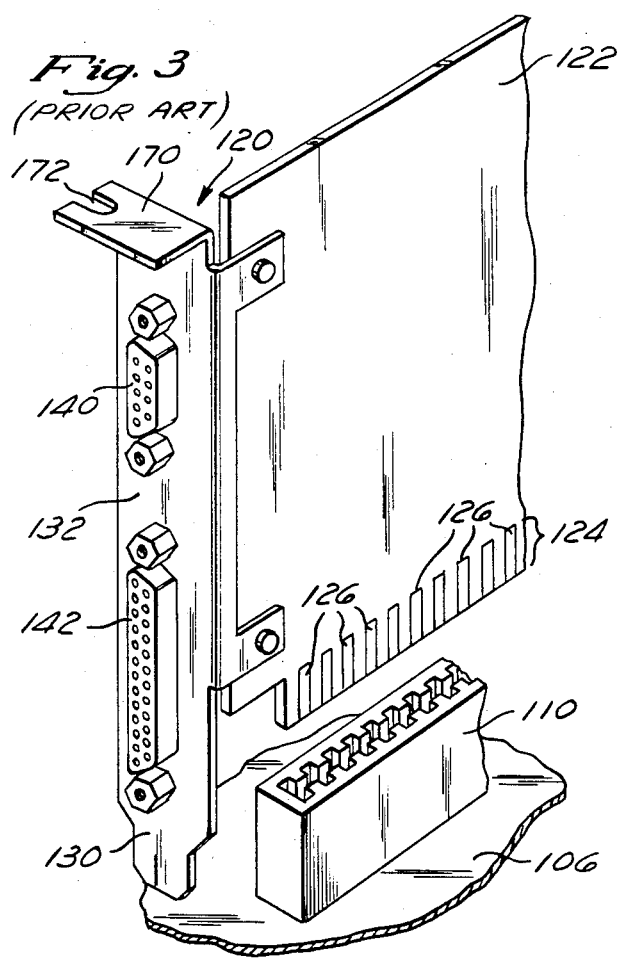
FIG. 3 is a partial, enlarged perspective view of an exemplary expansion card showing details of the vertical support member and the contacts that interface with the female bus connectors.

Continuing with FIG. 3, the expansion card 120 includes a support bracket 130 that is mechanically attached to the printed circuit board 122 to provide support for the printed circuit board 122 and to hold the printed circuit board 122 in place in the personal computer 100. The support bracket 130 typically comprises aluminum, or other suitable material, and is positioned so that a vertical support surface 132 is in a plane perpendicular to the plane of the printed circuit board 122. The vertical support surface 132 of the support bracket 130 is also used in the exemplary expansion card 120 as a means for mounting a pair of connectors 140 and 142. As a specific example, if the expansion card 120 is an exemplary combination card, for example, one that provides electronics for a video display unit (not shown) and a parallel printer (not shown), the connector 140 is advantageously a 9-socket connector to provide a means for interconnecting the video monitor to the expansion card 120. The connector 142 is advantageously a 25-pin connector to provide a means for interconnecting the parallel printer to the expansion card 120.

Figure 4:
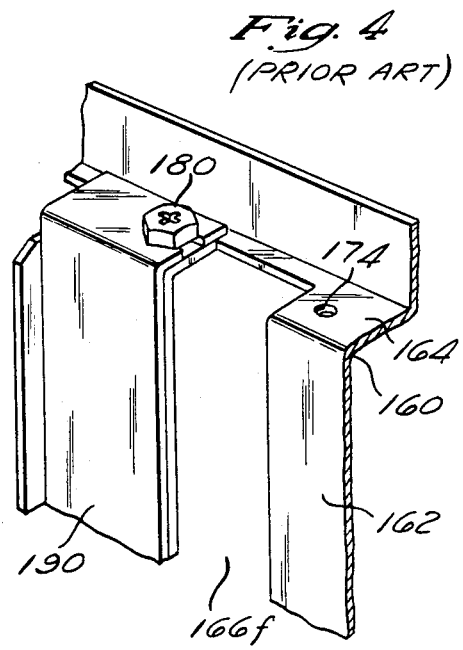
FIG. 4 is a partial, enlarged perspective view of the expansion card support frame of the exemplary personal computer showing additional details of the attachment of the electromagnetic emission shields to the expansion card support frame.

In order to provide access to the connectors 140 and 142 of the expansion card 120 and to connectors on other expansion cards, the frame 102 of the personal computer 100 in FIG. 1 includes an opening 150 that exposes the connectors 140, 142, when the expansion card 120 is positioned in the personal computer 100. The personal computer 100 further includes an expansion card support frame 160 that is positioned inside the personal computer 100 proximate to the opening 150 to partially block the opening 150 and to provide support for the expansion cards, such as the expansion card 120. The expansion card support frame 160 includes a vertical surface 162 and a horizontal surface 164. The frame 160 has a plurality of openings 166a–h formed in the vertical surface 162 and the horizontal surface 164 to allow the connectors, such as the connectors 140 and 142, to extend through the vertical surface 162. As illustrated in FIG. 2 and FIG. 4, each opening, such as the opening 166f, extends into the horizontal surface 164 of the expansion card support frame 160 to provide clearance for the connectors, such as the connectors 140 and 142, when the expansion card 120 is inserted into the computer 100 and moved vertically downward into one of the bus connectors 110.

Returning to FIG. 3, the expansion card support plate 130 includes a horizontal support surface 170 connected to the top of the vertical support surface 132 and positioned in a plane perpendicular to the plane of the vertical support surface 132 and also perpendicular to the plane of the printed circuit card 122. The horizontal support surface has an opening, such as a notch 172, formed therein. When the contacts 126 on the extended portion 124 of the printed circuit card 122 are engaged with the bus connector 110, the horizontal support surface 170 is positioned in contact with the horizontal surface 164 of the expansion card support frame 160. The horizontal surface 164 of expansion card support frame 160 includes a plurality of tapped holes 174 (FIG. 4) that are positioned proximate to each opening 166a–h. When the expansion card 120 is fully inserted into the personal computer 100, the notch 172 in the surface 170 of the expansion card support plate 130 is positioned over one of the tapped holes 174. A screw, such as the screw 180, is passed through the notch 172 and is screwed into the hole 174 to secure the expansion card support plate 130 to the expansion card support frame 160 to thereby hold the expansion card 120 in secure mechanical contact with the bus connector 110.

The expansion card support plate 130 serves the further purpose of blocking that portion of the opening 166b that is not occupied by the connectors 140 and 142. Since the electronic circuitry in the personal computer 100 generates electromagnetic radiation caused by rapidly switching signals when the personal computer 100 is operating, it is possible to generate electromagnetic interference which can radiate to televisions, radios, and other electronic devices. Thus, the exemplary personal computer 100 is preferably surrounded by the metallic frame 102 and the metallic cover 104 to block the electromagnetic interference. Since the openings 166a–h can allow the emission of electromagnetic radiation during the operation of the computer, each expansion card having output connectors has a support plate 130 constructed of metal or another suitable electromagnetic shielding material to block electromagnetic radiation. Furthermore, the openings that are not covered with an expansion card support plate 130, or the like, are each covered with electromagnetic shields 190, or the like. For example, in FIGS. 1 and 2, the openings 166c, 166e, 166g, and 166h, are covered with an electromagnetic shield 190. Thus, the combination of the electromagnetic shields 190 and the expansion card support plates 130 maintain the integrity of the electromagnetic shielding in the vicinity of the opening 150 in the frame 102 of the personal computer 100.

As illustrated in FIG. 2, and FIG. 2a, the centerline 192 of the bus connectors 110 is offset by approximately ¼ inch from the centerline 194 of the opening 166b. Thus, the centerline of a card plugged into a bus connector 110 is offset from the centerline of the respective opening 166a–h. Connectors on the card, e.g., the connectors 140 and 142 on the card 120, can be mounted to the printed circuit board 122 and be positioned in the center of the respective opening. Typically, the centerline of each connector 110 is approximately aligned with the left-hand vertical edge of the respective openings 166a–h, as shown in FIG. 2a for the opening 166f.

Each of the vertical openings 166a–h has a width of approximately ½ inch and a height of approximately 4 inches. Thus, an area of approximately two square inches is available for each input/output connector that is to be connected to the printed circuit board 122. It has been found that the limitation in surface area effectively prevents the interconnection of more than two connectors on a given expansion card 120. For example, an exemplary 25-pin connector 142 and an exemplary 9-socket connector 140 and their associated mounting hardware occupy nearly all of the vertical space available on the expansion card support plate 130. Thus, although the amount of circuitry that can be placed on an exemplary printed circuit board 122 is steadily increasing as the complexity of integrated circuits increases, the complexity of the expansion cards used for input/output purposes has been limited by the number of input/output connections that could be provided through the opening in the frame of the computer.

A number of expansion products have devised means for partially overcoming this limitation. For example, some products utilize a multi-wire jumper cable (not shown) from the printed circuit card 122 to an input-/output connector (not shown) that is mounted on a separate electromagnetic shield 190. Although this product provides an additional input/output connector, it is accomplished by sacrificing one of the openings 166a–h that would otherwise be available for another expansion card. Thus, the product is not usable if the personal computer 100 has a full complement of eight expansion cards. Other products have utilized a single connector on the expansion card support plate 130 and have coupled the connector to an external box (not shown) that has a plurality of input/output connectors attached to it. Although such products have utility when the signals to be provided to each of the connectors in the expansion box are substantially identical, the products have limited flexibility when it is necessary to provide different signals to each of the connectors. Thus, a need continues to exist for a means for expanding the input/output capabilities of an expansion card in a personal computer 100.

Figure 5:
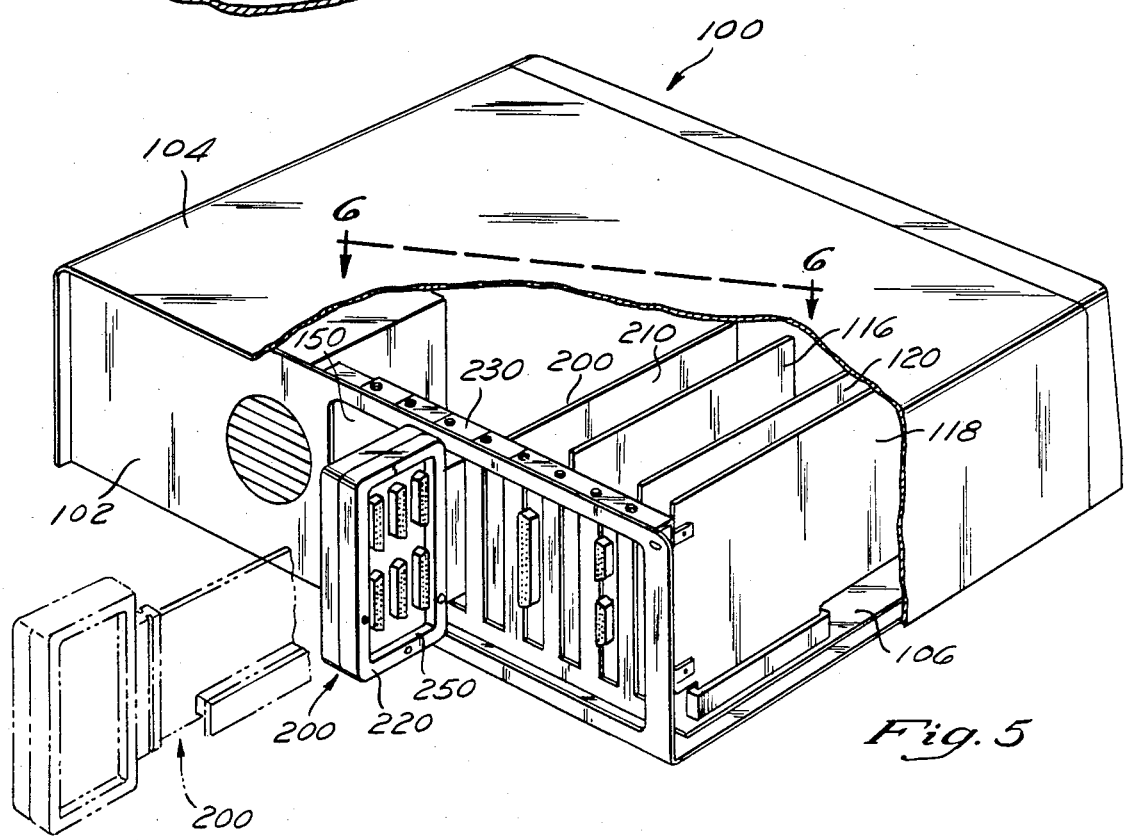
FIG. 5 is a partially broken-away perspective view of the exemplary personal computer of FIG. 1 showing the expansion card of the present invention installed in the personal computer and further showing (in phantom) that the expansion card is installed from the outside of the personal computer through one of the openings in the expansion card support frame.
Figure 9:
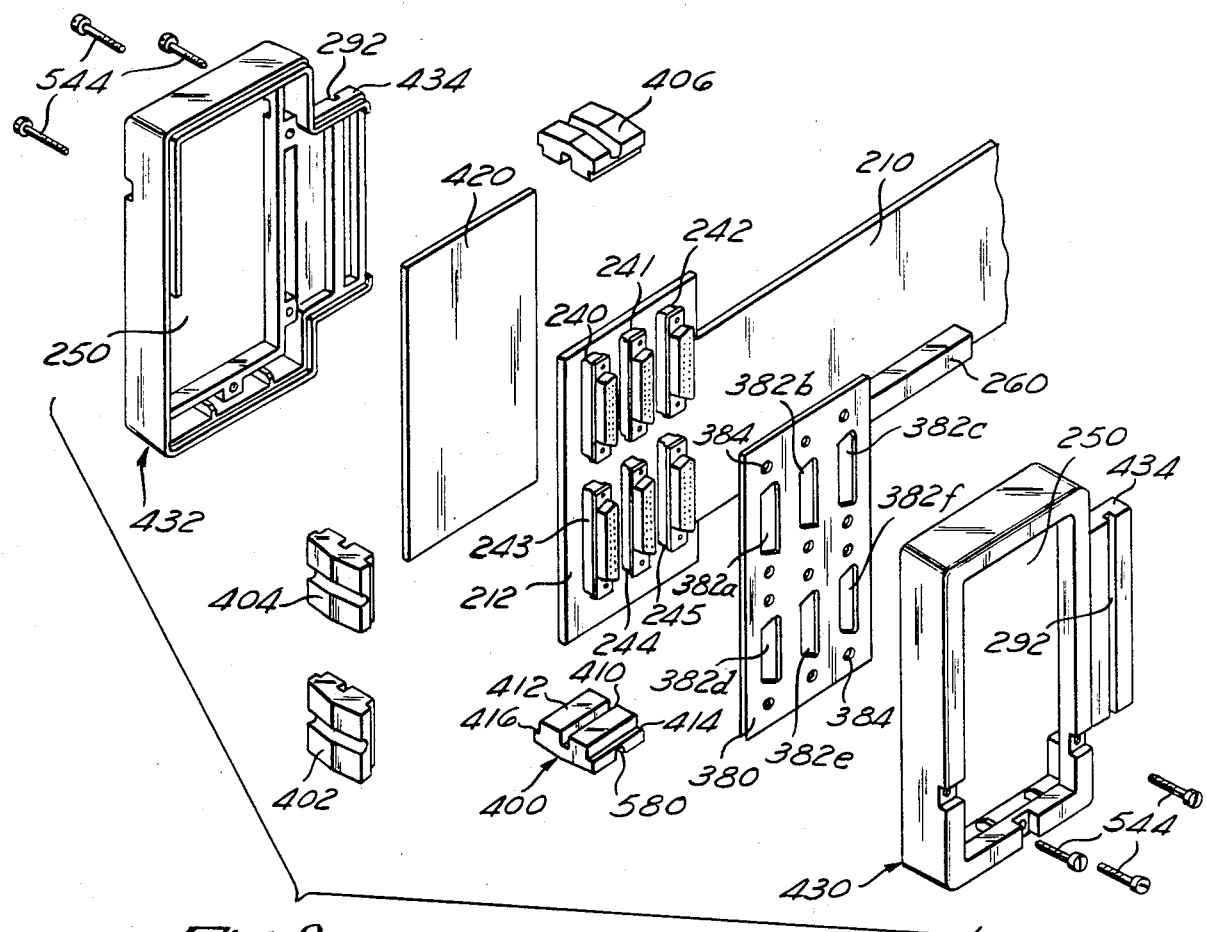
FIG. 9 is an exploded view of the present invention showing the relationship between the first and second enclosure halves, the printed circuit board, the metal plates, and the spacers that hold the printed circuit board and the plates in a fixed spatial relationship.
Figure 10:
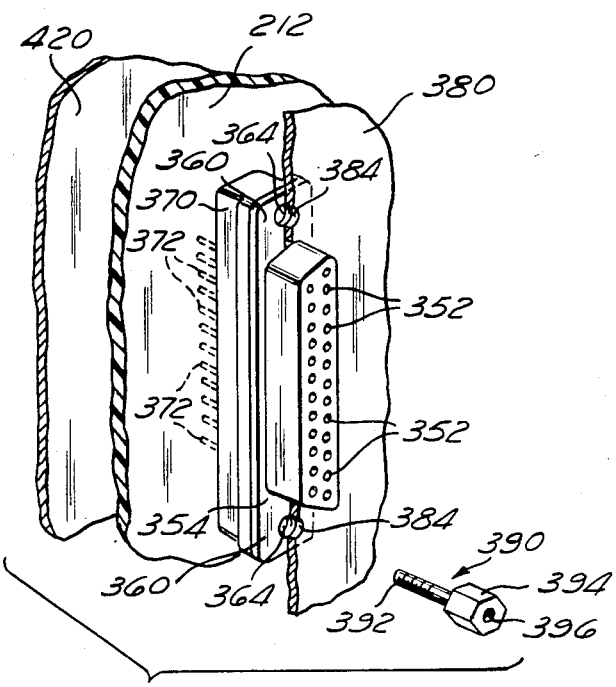
FIG. 10 is a partial enlarged perspective view showing the assembly of one of the connectors to the printed circuit board and to the metal plate.

An extender card 200 built in accordance with the present invention is illustrated in FIGS. 5–17. In FIG. 5, the extender card 200 is shown in phantom prior to insertion into the personal computer, and is shown in solid lines after it is inserted in the personal computer 100 through the opening 166f. The extender card 200 comprises a printed circuit card 210 having an extended portion 212 (FIG. 9) that extends through the opening 166f and is enclosed by an enclosure 220. In order that the printed circuit board 210 will fit through the opening 166f, it has a height relative to the base of the computer that is less than the heigth of the opening. For example, in exemplary embodiments of the present invention, the printed circuit board 210 has a height of approximately 2.9 inches. The printed circuit board 210 and the enclosure 220 are held in place in the personal computer 100 by a specially adapted expansion card support member 230, which will be described more fully in connection with FIG. 7. The extended portion 212 of the printed circuit board 210 provides electrical interconnection to a plurality of electrical connectors 240, 241, 242, 243, 244, 245, (labelled in FIGS. 7 and 14) that are thereby accessible from the outside of the personal computer 100 through a rectangular opening 250 formed in the side of the enclosure 220. (An identical rectangular opening 250 is formed on the opposite side of the enclosure 220 as shown in FIG. 9.) Although illustrated as identical connectors, the connectors 240-245 can be different sizes and shapes, depending upon the particular input/output signals generated and received by the printed circuit board 210.

FIG. 7 illustrates the relationship between the expansion card 200 and the bus connector 110. In FIG. 7, the frame 102, the card support frame 160, and the cover 104 of the personal computer 100 are omitted for clarity. As illustrated, the expansion card 200 includes an offset connector 260 that is electrically connected to the printed circuit board 210 through a spacer 262. This is illustrated more clearly in FIG. 8, which is an exploded view of a partial section from FIG. 7. As illustrated, the offset connector 260 includes a plurality of etched contacts 270, which can advantageously be constructed in the same manner as the contacts 126 on the exemplary printed circuit board 122 in FIG. 3. Each of the contacts 270 is electrically connected via a printed circuit line 272 to a plated-thru hole 274. The plated-thru holes 274 are aligned horizontally and are equally spaced by a distance of approximately 0.1 inch. The offset connector 260 also includes a plurality of contacts (not shown) on the opposite side from the contacts 270. Each of the contacts on the opposite side is electrically connected to a plurality of plated-thru holes 276 that are spaced apart from each other by a distance of 0.1 inch and are aligned horizontally in a row that is spaced apart from the first row of the plated-thru holes 274 by a distance of 0.1 inch. The spacer 262 comprises a thermoplastic dielectric material having a thickness T, and is penetrated by two rows of electrically conductive posts 280. For example, the posts 280 can comprise a copper alloy. The posts 280 in each row are spaced apart from each other by a distance of 0.1 inch, and the two rows of posts 280 are spaced apart by a distance of 0.1 inch, so that the spacing of the posts 280 matches the spacing of the plated-thru holes 274 and 276. The printed circuit board 210 also has a plurality of plated-thru holes 282. The plated thru holes 282 are electrically connected to electronic circuitry on the printed circuit board 210 in a conventional manner. The plated-thru holes 282 are positioned in two rows such that the palted-thru holes 282 in each row are spaced apart by 0.1 inch and each of the two rows is spaced apart by 0.1 inch. Thus, the plated-thru holes 282 match the spacing of the posts 280 and the plated-thru holes 274 and 276. Each of the posts 280 on the spacer 262 has a sufficient length so that one end of each post 280 can be inserted through a respective one of the plated-thru holes 282 in the printed circuit board 210 and mechanically and electrically connected thereto by soldering or other suitable means. Similarly, the opposite ends of each of the posts 280 can be inserted through one of the plated-thru holes 274 and 276 in the offset connector 260 and soldered thereto. Thus, the contacts 270 on the offset connector 260 are electrically connected via the post 280 to the circuitry on the printed circuit board 210. When the present invention 200 is inserted in the personal computer 100, the printed circuit board 210 is preferably aligned with the center line of the opening 166f. The offset distance provided by the thickness T of the spacer 262 is selected so that the offset connector 260 is aligned with the centerline of the bus connector 110 when the printed circuit board 210 is aligned with the center line of the opening 166f. For example, the thickness T is approximately ¼ inch.

Figure 15:
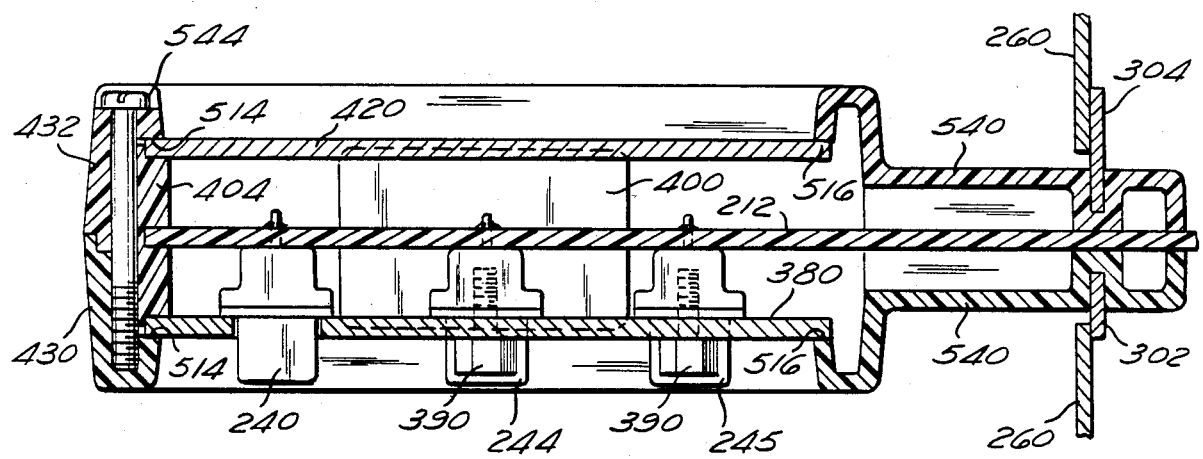
FIG. 15 is a cross sectional view of the expansion card taken along the lines 15—15 in FIG. 14 showing the printed circuit card and the two metal plates held in fixed spatial relationship by one of the spacers and one of the screws.
Figure 14:
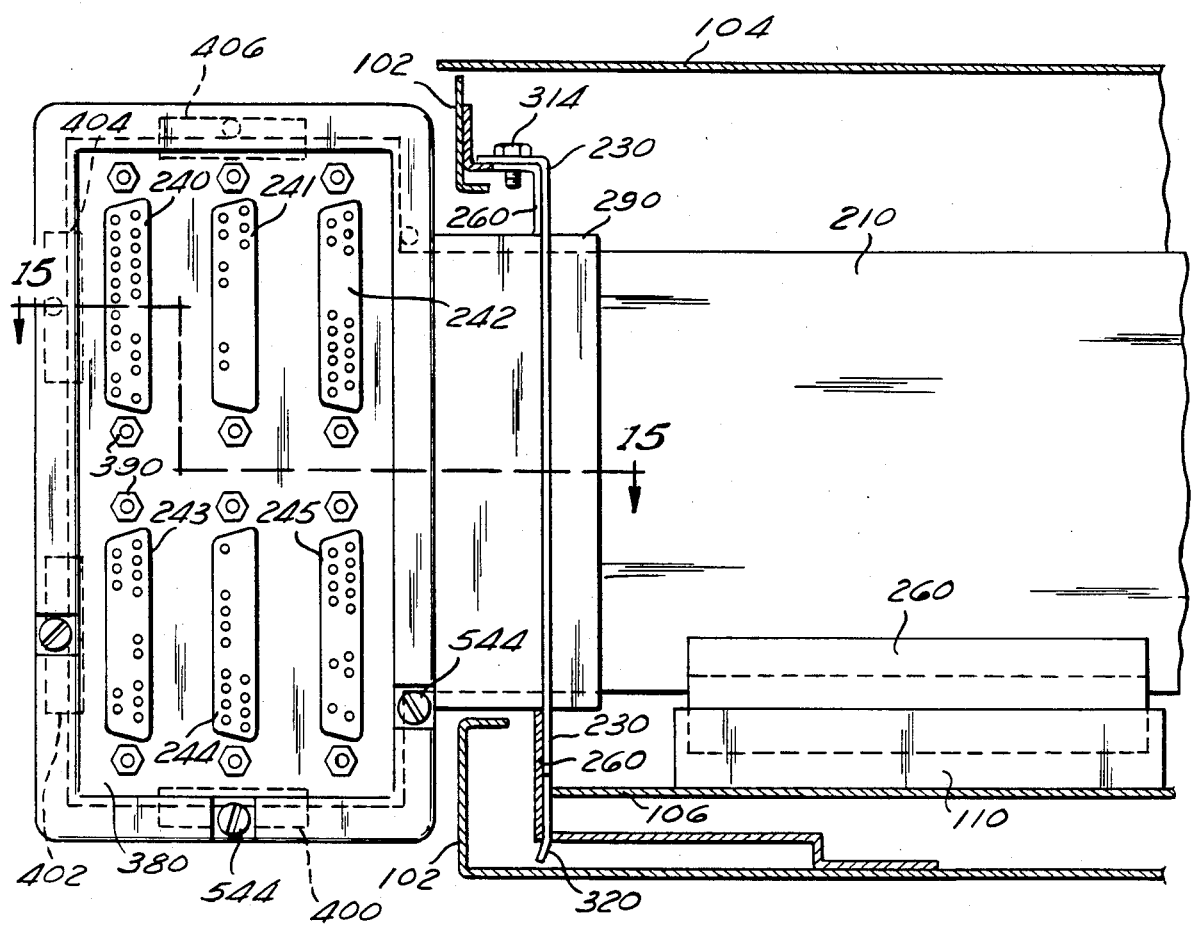
FIG. 14 is a partial cross sectional plan view showing the installation of the expansion card of the present invention in the personal computer.

As illustrated in FIG. 6, and as shown more clearly in FIGS. 7, 14 and 15, the enclosure 220 includes an extended portion 290 that extends through the opening 166f of the personal computer. The extended portion 290 includes two vertical grooves 292 that are adapted to receive the expansion card support member 230. As shown in FIG. 7, the support member 230 includes a vertical notch 300 that divides the vertical portion of the support member 230 into a first vertical leg 302 and a second vertical leg 304. After the printed circuit board 210 is inserted into the personal computer 100 and the offset connector 260 is engaged with the bus connector 110, the support member 230 is pushed vertically downward over the extended portion 290 of the enclosure 220 so that the mating portions of the first vertical leg 302 and the second vertical leg 304 engage the grooves 292 on the extended portion 290 of the enclosure 220, as illustrated in FIGS. 14 and 15. The support member 230 has a horizontal portion 310 (FIG. 7) that contacts the horizontal surface 164 of the expansion card support frame 160 when the support member 230 is fully engaged in the grooves 292. The horizontal surface 310 of the support member 230 has an opening, such as an elongated hole 312 formed therein, so that the support member 230 can be secured in its engaged position by a screw 314. Thus, when so secured, the support member 230 provides a vertical restraint to prevent the offset connector 260 from being disengaged from the bus connector 110 and also provides a horizontal restraint against the grooves 294 in the extended portion 290 to prevent any force applied against the enclosure 220 from being transmitted to the printed circuit board 210 and thus to the offset connector 260. Preferably, the vertical support member 230 includes an extended portion 320 that extends through an opening in the lower portion of the expansion card support frame 160 to provide additional horizontal restraint as illustrated in FIG. 14. Preferably, the extended portion 290 rests on the portion of the expansion card support frame that forms the bottom of the opening 166f, as shown in FIG. 14, so that the force caused by the weight of the enclosure 220 and the connectors 240-245 is applied against the expansion card support frame 160 rather than against the connection between the offset connector 260 and the bus connector 110. The support member 230 blocks any portion of the opening 166f not occupied by the extended portion 290 of the enclosure 220. Thus, the support member 230 provides electromagnetic shielding, as discussed above in connection with the prior art. In preferred embodiments of the present invention, the support member 230 comprises a metal, such as aluminum. Alternatively, the support member 230 can comprise another conductive material, such as thermoplastic ABS, or the like, coated with a metallic plating, such as nickel.

FIG. 9 is an exploded view of the present invention, showing the printed circuit board 210 the extended portion 212, and other subassemblies in more detail. As shown in FIG. 9, the connectors 240–245 are mounted on the extended portion 212. For example, the connectors 240–245 are D-subminiature connectors, available from AMP, Amphenol, or the like, that are intended to be mounted directly onto a printed circuit board. As further illustrated in FIG. 10, each connector, such as the connector 240, comprises a mating shell 350 having pins or sockets secured therein. For example, the connector 240 illustrated in FIG. 10 has 25 pins 352 positioned within the shell 350. The shell 350 is secured to a flange 354 having two ears 360. Each ear 360 has a threaded hole 364 formed therein. The flange 354 is mounted to a spacer 370, which comprises an insulating material such as nylon, or the like. The spacer 370 supports a plurality of electrically conductive posts 372 that are electrically connected to the pins 352. The posts 372 are soldered to the extended portion 212 of the printed circuit board 210 in a conventional manner. A first metallic blocking plate 380 comprising steel or another suitable material, is provided that has a plurality of holes 382a–f formed therein. The holes 382a–f have their dimensions selected so that the holes 382a–f are the same shape as, and slightly larger than, the outer dimensions of the shells 350 of the connectors 240–245. The holes 382a–f are positioned with respect to each other so that the metal plate 380 will fit around the shells 350 of the connectors 240–245. The metal plate 380 also has a plurality of circular holes 384 (e.g., two holes per connector 240–245) that are positioned with respect to the holes 382a–f so that the holes 384 are substantially aligned with the holes 364 in the ears 360 of the flange 354 of each of the connectors 240–245. The metal plate 380 is secured to the connector 240, for example, by a pair of hex-headed screws 390 that are commercially available parts that are specially adapted for use with the connectors 240–245. Each of the hex-headed screws 390 includes a male threaded portion 392 that is adapted to engage the threaded holes 364 in each of the flanges 354, and has a hex-headed portion 394 that is adapted to be engaged by a standard hex-nut driver, or the like. The hex-headed portion 394 has a threaded hole 396 formed therein in alignment with the male thread 392. When the hex-headed screw 390 is securely positioned with respect to the connector 240 the threaded hole 396 is positioned to engage a corresponding male thread on a connector (not shown) that is selected to mate with the connector 240. When so engaged, the mating connector (not shown) is firmly secured to the connector 240 in a manner known to the art so that the electrical connection cannot be inadvertently broken.

In addition to providing support for the connectors 240–245, the first blocking plate 380 substantially prevents the emission of electromagnetic radiation through the side of the enclosure 220 since it blocks the portion of the rectangular opening 250 that is not blocked by the connectors 240–245.

Although the plate 380 is described above as a metal plate, other suitable materials, such as high impact plateable ABS plastic can be used so long as the material provides electromagnetic shielding of the extended portion 212 of the printed circuit board 210. For example, a plate 380 of ABS plastic can advantageously be plated with nickel to provide the shielding.

Returning to FIG. 9, the present invention 200 further includes a plurality of spacers 400, 402, 404 and 406, that are used to space the plate 380 at a selected distance from the extended portion 212 of the printed circuit board 210. For example, the spacer 400 includes a slot 410 formed in one surface 412 thereof. The slot 410 has a width selected to receive the thickness of the extended portion 212 of the printed circuit board 210. The surface 412 of the spacer 400 further includes a ledge 414 that is spaced apart from the slot 410 by a distance substantially equal to the distance between the extended portion 212 and the plate 30 when the plate 380 is secured to the flanges 350 of the connectors 240–245. The distance between the slot 410 and the ledge 414 of the spacer 400 is selected to hold the plate 380 in a plane substantially parallel to the plane of the extended portion 212 of the printed circuit board 210, irrespective of any discrepancies in the spacing of the flanges 354 from the extended portion 212 of the printed circuit board 210. This is illustrated more clearly in FIG. 15, wherein the extended portion 212 of the circuit board 210 is shown centered between the plate 380 and the plate 420. Thus, the spacing provided by the spacers 400, 402, 404, and 406 will substantially reduce or eliminate any uncertainty in the spacing of the plate 380 that might be caused by discrepancies in the dimensions of the spacer 370 of each connector 240–245 or discrepancies in the spacing caused by the positioning of the connectors during the soldering process. Furthermore, the spacers 400, 402, 404, 406 serve to absorb forces applied to the connectors 240–245 when the mating connectors (not shown) are inserted in the connectors 240–245. Thus, the mating forces are not applied to the soldered connections of the pins 372 to the extended portion 212 of the printed circuit board 210.

As shown in FIG. 9, the surface 412 of the spacers 400, 402, 404, and 406 each includes a second ledge 416 that is spaced apart from the slot 410 by substantially the same distance as the first ledge 414. The present invention includes a second blocking plate 420 that is positioned in contact with the ledges 416 of the spacers 400, 402, 404, and 406, and is thus spaced apart from the extended portion 212 of the printed circuit board 210 by substantially the same distance as the first blocking plate 380. In the embodiment shown, the second plate 420 is a solid plate of metal, such as steel, or a metallic coated material such as nickel-plated ABS plastic. The second plate 420 has no openings for connectors and blocks the entire opening 250 on its side of the enclosure 220. However, in alternative embodiments, connectors can be positioned on the side of the extended portion 212 of the printed circuit board 210 that faces toward the second plate 420. In such embodiments, the plate 420 would have openings formed therein to surround any such connectors.

The enclosure 220 in FIG. 7 is shown in FIGS. 9 and 11 as a first enclosure half 430 and a second enclosure half 432. In a preferred embodiment, the second enclosure half 432 is identical to the first enclosure half 430 so that the two enclosure halves are interchangeable. The enclosure halves 430 and 432 are preferably constructed from a high impact plastic, such as ABS, and are preferably formed by injection molding. The ABS plastic is plateable, and, in preferred embodiments, the first enclosure half 430 and the second enclosure half 432 are each plated with nickel or another suitable metallic plating material to provide electromagnetic shielding for the extended portion 212 of the printed circuit board 210. Each enclosure half 430, 432 has a projecting portion 434 extending therefrom. The projected portions 434 of the first enclosure half 430 and the second enclosure half 432 form the extended portion 290 of the enclosure 220, as shown in FIG. 7. The rectangular openings 250 that provide access to the respective plates 380 and 420 and thus to the connectors 240-245 are formed in the enclosure halves 430 and 432.

As set forth above, the first enclosure half 430 and second enclosure half 432 are identical. This has the particular advangtage that only one mold need be constructed for an enclosure half. Any two enclosure halves can be used to construct a complete enclosure 220. Thus, in FIG. 11, the enclosure half 432 can be considered to be the opposing view of the enclosure half 430. The enclosure halves 430 and 432 are each asymmetrical about a centerline shown in phantom as a line 438. The portion above the centerline 438 of the first enclosure half 430 has a one-to-one correspondence with the portion below the centerline 438 of the second enclosure half 432, and the portion below the centerline 438 of the first enclosure half as a one-to-one correspondence with the portion above the centerline 438 of the second enclosure half 432. Each of the enclosure halves 430, 432 are constructed so that the two halves will overlap when the enclosure 220 is assembled. The overlapping of the two enclosure halves 430 and 432 thus provides a continuous electromagnetic shield when the enclosure 220 is fully assembled.

Each enclosure half 430, 432 comprises a first cross member 440 and a second cross member 442. The first cross member 440 and second cross member 442 are interconnected by a forward vertical member 444 and a rear vertical member 446 so that the four members 440, 442, 444, 446 frame the rectangular opening 250. The first cross member 440 has a cross section as illustrated in FIG. 12 (taken along the lines 12—12 on the first enclosure half 430 in FIG. 11). As illustrated, the first cross member 440 has a generally J-shaped cross section that comprises an outer wall 450, a shorter inner wall 452, and an interconnecting portion 454 that forms a facing wall 454. The outer wall 450 has an outer surface 460, an inner surface 462, and an end 464. A portion of the end 464 is removed to form a ledge 466 with respect to the inner surface 462. Thus, the ledge 466 faces the inner surface 462. The J-shaped cross section of the first cross member 440 continues onto the rear vertical member 446 proximate to the first cross member 440, as illustrated by the broken cross section at 468. This cross section continues to the centerline 438 wherein the cross section changes to a different cross section that continues into the second cross member 442.

The cross section of the second cross member 442 is illustrated in FIG. 13 which is taken along the lines 13—13 on the enclosure half 432 in FIG. 11. As illustrated in FIG. 13, the second cross member 446 has a generally J-shaped cross section comprising an outer wall 470, an inner wall 472, and an interconnecting portion 474 that forms a facing wall 474. The outer wall 470 has an outer surface 480, an inner surface 482 and an end 484. The end 484 is extended proximate to the inner surface 482 so that an outwardly facing ledge 486 is formed. The cross section of the second cross member 442 continues onto the rear vertical member 446 as illustrated by the broken cross section at 488 on the first enclosure half 430 and the broken cross section 490 on the second enclosure half 432.

The cross section of the forward vertical member 444 proximate to the first cross member 440 has an inwardly facing ledge 492 and the cross section of the forward vertical member proximate to the second cross member 442 has an outwardly facing ledge 494. The structure of the forward vertical member 444 can be seen more clearly with respect to the enclosure half 432 in FIG. 11.

When the two enclosure halves 430 and 432 are engaged during the assembly of the enclosure 220, the inwardly facing ledges (e.g., the ledge 466 of the first cross member 440) and the outwardly facing ledges (e.g., the ledge 486 of the second cross member 442) overlap to provide structural stability for the enclosure 220. The overlapping of the ledges 466, 486 prevents the two enclosure halves 430 or 432 from moving horizontally or vertically with respect to each other. Furthermore, the overlapping of the ledges effectively blocks the emission of electromagnetic radiation through the junction of the two enclosure halves 430, 432.

The inner wall 452 of the first cross member 440, the inner wall 472 of the second cross member 446, an inner wall 496 of the rear vertical member 442, and an inner wall 498 of the forward vertical member 444 form a continuous inwardly facing frame that defines the rectangular openings 250 in each of the enclosure halves 430, 432. Similarly, the facing wall 454 of the first cross member 440, the facing wall 474 of the second cross member 442, a facing wall 500 of the rear vertical member 446 and a facing wall 502 of the forward vertical member 444 form a substantially rectangular outwardly facing frame.

The inner walls 452, 472, 496, and 498 each has an end 510, 512, 514, and 516, respectively, that lie in a plane. When the present invention is fully assembled, the plate 380 (FIG. 9) lies against the ends 510, 512, 514 and 516 of the first enclosure half 430. Similarly, the plate 420 (FIG. 9) lies against the ends 510, 512, 514 and 516 of the second enclosure half 432. (See FIG. 15.) The first plate 380 and the second plate 420 are maintained in this position by the spacers 400, 402, 404, 406. This is illustrated with respect to the spacer 404 in FIG. 15. Thus, the first plate 380 and the second plate 420 are forced against the ends 510, 512, 514 and 516 of the inner walls 452, 472, 496, and 498 to provide a seal against the emission of electromagnetic radiation.

As further illustrated in FIG. 11, the enclosure halves 430 and 432 preferably include pairs of ribs that are positioned between the respective inner and outer walls of the first cross member 440, the second cross member 442 and the rear vertical member 446. For example, a first pair of ribs 520 and 522 are shown positioned between the inner wall 452 and the outer wall 450 of the first cross member 440. Similarly, a second pair of ribs 524 and 526 are shown positioned between the inner wall 472 and the outer wall 470 of the second cross member 442. The ribs 520 and 522 and the ribs 524 and 526 are spaced apart by a distance substantially equal to the length of the spacer 400, (shown as $L_S$) so that the spacer 400 is secured by the ribs 520, 522, 524 and 526. The other spacers 402, 404 and 406 (FIG. 9) are similarly held in place by the other pairs of ribs (not shown).

The forward vertical member 44 has an outer wall 530 that has a first extended portion 532 and a second extended portion 534 that are both extended outward in a direction parallel to the centerline 438. Furthermore, the first extended portion 532 and the second extended portion 534 are positioned equidistantly from the centerline 438. Each of the extended portions 532 and 534 has a ledge which is an extension of the corresponding ledge on the outer wall 530 of the forward vertical member 444. For example, the first extended portion 522 has an inwardly facing ledge 536, and the seconded extended portion 534 has an outwardly facing ledge 538. The first extended portion 532 and the second extended portion 534 are interconnected by a vertical side portion 540 that is substantially parallel to the facing walls 454, 474, 500 and 502, described above. The grooves 292 are formed in the sides 540 and extend through the first extended portions 532 and the second extended portions 534 of each enclosure half 430, 432.

In preferred embodiments of the present invention, the first enclosure half 430 and the second enclosure half 432 are fastened together by six screws 544 (FIG. 9). Each enclosure half has three bores 550 formed through the facing wall 474 of the second cross member 442. Preferably, the bore 550 is centered with respect to the second cross member 442, and through the facing walls 500 and 502 of the rear vertical member 445 and the forward vertical member 444, respectively, between the centerline 438 and the second cross member 442. A boss 552 of plastic is formed around each bore 550. Each enclosure half 430, 432 further includes bosses 556 between the inner and outer walls 452 and 452 of the first cross member and between the inner and outer walls of the forward and rear vertical members between the centerline 438 and the first cross member 440. The bosses 556 are positioned so that they are juxtaposed with the bosses 552 when the two enclosure halves 430, 432 are assembled. A threaded hole 558 is formed in each of the bosses 556 and is positioned to receive the outer threads of a screw 544 which is passed through the bore 550 in the corresponding opposed boss 552. The threads of the holes 558 can be formed directly into the plastic of the bosses 556 as shown in FIG. 12, or alternatively, as shown in FIG. 12b, a threaded metallic insert 560 can be positioned in the boss 556 to receive the threads of the screw 544 to reduce the possibility of stripping the threads.

In preferred embodiments of the present invention, a portion of the plastic material is removed from the second cross member 442, the forward vertical member 444, and the rear vertical member 446, proximate to the bores 550, to form recesses 562 so that the heads of the screws 544 can be recessed when fully engaged with their respective threaded holes. The bores 550 and the threaded holes 558 are centered between the ribs 520, 522 and 524, 526, and the corresponding ribs (not shown) on the other members. Thus, the screws 544 pass through the spacers 400, 402, 404 and 406, that are positioned between the ribs. Each of the spacers 400, 402, 404 and 406 has a groove 580 formed in a second surface 582 opposite the first surface 412. The groove 580 is perpendicular to the slots 410 and the ledges 414 and 416. When the spacers 400, 402, 404, 406 are positioned between the corresponding ribs the grooves 580 provide clearance for the screws 544.

Unlike previously known expansion cards which are inserted into the expansion slots from the top of the computer 100, expansion cards 200 constructed in accordance with the present invention are inserted into the computer 100 through one of the openings (e.g., the opening 166f) in the expansion card support frame 160 and then mated with the expansion slot 110 via the offset connector 260. The length of the printed circuit board 210 of the present invention is advantageously selected so that the extended portion 210 (FIG. 9) remains outside of the computer frame 102 to provide the means for mounting the connectors 240-245 outside the computer 100 without using interconnection cables or the like. Furthermore, as one skilled in the art will recognize, the connectors 240-245 are directly interconnected to the circuitry of the printed circuit board 210 that is inside the computer 100. The direct connections are obtained by printed circuit lines on the portion of the printed circuit board 210 that passes through the opening 166f. Thus, rather than being limited to the 50 or so lines that can be connected to connectors mounted on an exemplary vertical support member, as in the prior art, the present invention provides a means for direct connection of each of the pins on the input/output connectors 240-245 via an individual printed circuit line to the circuitry on the portion of the printed circuit card 210 mounted inside of the computer. For example, if the printed circuit lines are 0.01 inch wide and are spaced apart by 0.01 inch, then approximately 100 printed circuit lines can be run on each side of the printed circuit board 210. Further, the printed circuit board 210 can be constructed with multiple layers to further increase the number of interconnection lines available. Since the interconnections are accomplished by soldering the leads of the connectors 240-245 directly onto the extended portion 212 of the printed circuit board 210, there is less opportunity for assembly errors to occur during the construction of the invention than might occur if a cable harness were to be constructed to connect an independent expansion box to a common connector. Thus, the reproduceability (i.e., the probability of construction without assembly errors) of the present invention is thereby increased over previous devices.

As described above, the enclosure halves 430 and 432 are advantageously identical so that only one mold is necessary in order to construct the two parts for the enclosure 220. Furthermore, the framed opening 250 in each enclosure half 430, 432 is independent of the connector configuration. Thus, a manufacturer of expansion boards constructed in accordance with the present invention need stock only one type of enclosure half and a plurality of blank plates 420. The blank plates 420 are readily adaptable, e.g., by hole punching or the like, to form a plate 380 to accommodate any configuration of connectors that will fit within the area provided by the opening 250 in each enclosure half 430, 432. Thus, is not necessary modify the enclosure halves 430, 432 to accommodate different connector configurations for different expansion cards.

Figure 16:
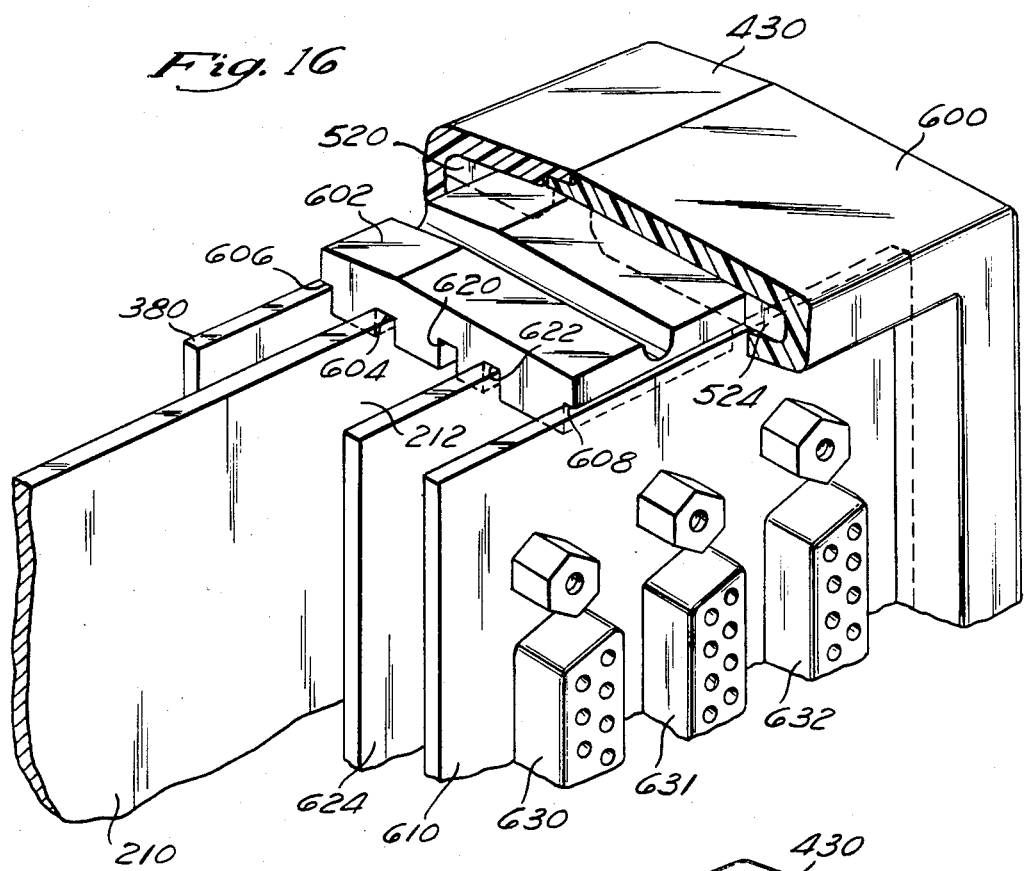
FIG. 16 is a partial, broken-away perspective view of an alternative embodiment of the present invention having an enlarged enclosure half and an enlarged spacer to accommodate an additional printed circuit board between the extended printed circuit board and one of the metal plates so that additional connectors can be electrically connected to the expansion card.
Figure 17:
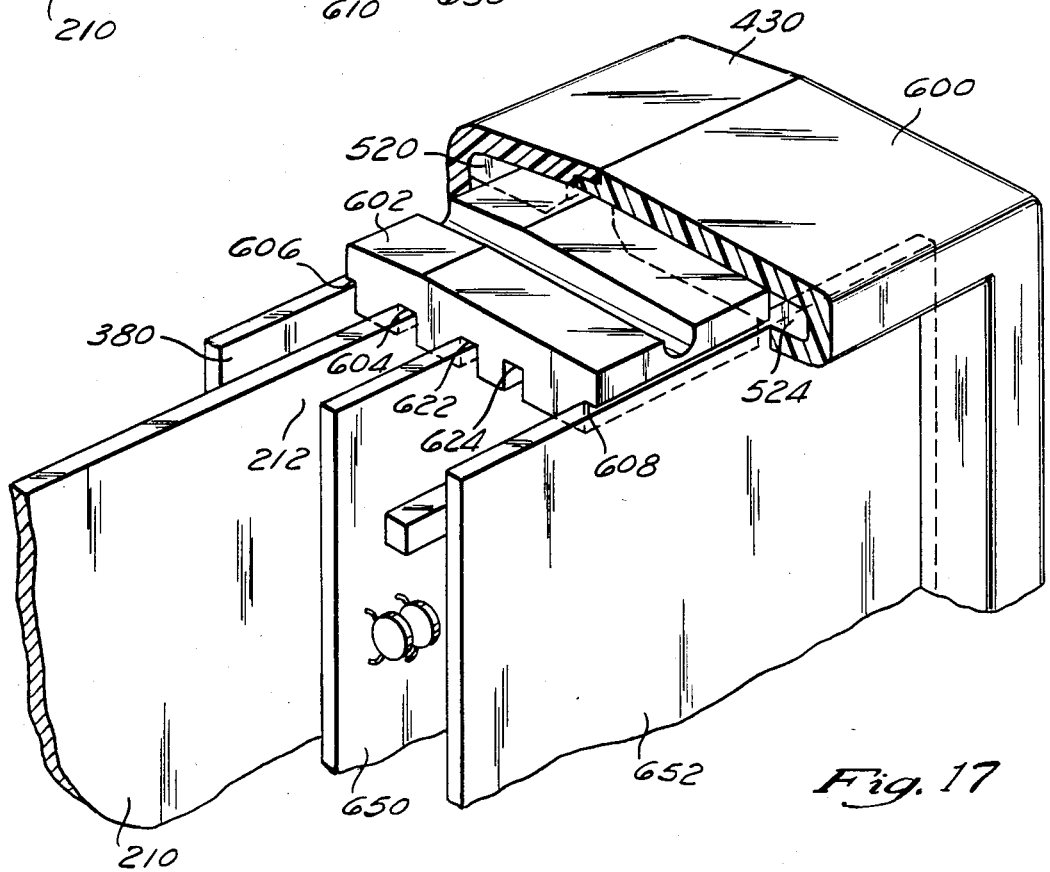
FIG. 17 is a partial, broken-away perspective view similar to FIG. 16, but showing an alternative embodiment of the present invention having an enlarged enclosure half and an enlarged spacer to accommodate an additional printed circuit board between the extended printed circut board and one of the metal plates so that components can be mounted to the additional printed circuit board and electrically connected to the expansion card.

FIGS. 16 and 17 illustrate alternative embodiments of the present invention in which one of the enclosure halves, for example the enclosure half 432 is replaced with an enlarged enclosure half 600. Further, the spacers 400, 402, 404, 406 are replaced with spacers, such as a spacer 602 which are asymmetrically enlarged with respect to the spacers 200, 202, 204 and 206 to conform with the enlarged dimension of the enclosure half 600. The spacer 602 includes a first slot 604 that receives the extended portion 212 of the printed circuit board 210, a first ledge 606 that engages the plate 380 and a second ledge 608 that engages a plate 610. The spacer 602 further includes a second slot 620 and a third slot 622 that are interposed between the first slot 604 and the second ledge 608. The third slot 622 in FIG. 16 is used to accommodate an additional printed circuit board 624. The additional printed circuit board 624 has a plurality of connectors attached thereto, such as the connectors 630, 631, and 632, which may be similar to the connectors 240-245 of FIGS. 7, 9, 10, 14, and 15. The printed circuit board 624 is electrically connected to the extended portion 212 of the printed circuit board 210 by flexible wires or other conventional means (not shown). The metallic plate 610 has openings formed therein to accommodate the connectors 630-632 and their associated mounting hardware. In this example, the additional printed circuit board 624 is positioned in the third slot 604 of the spacer 622 so that the additional printed circuit board 624 is spaced apart from the metal plate 610 by substantially the same distance as the extended portion 212 of the printed circuit board 210 is spaced apart from the metal plate 380.

In the further alternative embodiment illustrated in FIG. 17, an alternative additional printed circuit board 650 is positioned in the second slot 620 and is electrically connected to the extended portion 212 of the printed circuit board 210 by flexible wires or other conventional means (not shown). In the embodiment of FIG. 17, the printed circuit board 650 is spaced apart from a solid metallic plate 652 which can advantageously be substantially identical to the solid metallic plate 420 of FIG. 9. The additional spacing between the second slot 620 and the metallic plate 652 provides room so that components (i.e., resistors, capacitors, integrated circuits, etc.) can be mounted on the printed circuit board 650. Thus, this alternative embodiment provides a means for electrically connecting additional circuitry to the circuitry on the printed circuit board 210. Although not shown, additional components and connectors can be combined on the additional circuit board 650 by providing leads on the connectors of sufficient length so that the connectors can extend through appropriately spaced openings in the metal plate 420.

As set forth above, the enclosure 220, now comprising the first enclosure half 430 and the second enclosure half 600 is fully electromagnetically shielded by the metallic plating on the enclosure halves so that the circuitry on the second printed board 650 does not radiate any undesirable electromagnetic radiation. The enlarged enclosure half 600 is interchangeable with either the first enclosure half 430 or the second enclosure half 430 and can therefore be stocked as an alternative to either enclosure half.

Although preferred embodiments of this invention have been disclosed herein, those skilled in the art will appreciate the changes and modifications may be made therein without departing from the spirit and scope of this invention as defined in the appended claims.

I claim:

1. An apparatus for interconnecting a female connector defining an expansion slot in a computer with a plurality of input/output connectors, comprising:

a male connector having a male portion for mechanical insertion into said expansion slot, said male connector further having a plurality of electrical contacts arranged so that, in an inserted position when the male connector is inserted in the expansion slot, the male and the female connectors are electrically connected;

a printed circuit board electrically connected to said male connector so that in the inserted position, the printed circuit board is electrically connected to said female expansion slot connector, said printed circuit board further having a sufficient length so that in the inserted position, an extended portion of the printed circuit board extends through an opening in an outer frame of the computer;

a plurality of input/output connectors electrically connected to said extended portion of the printed circuit board; and an enclosure surrounding said extended portion of the printed circuit board, said enclosure including means for electromagnetic shielding, and including an attachment portion having means for mechanically interconnecting said enclosure with the outer frame of the computer.

2. The apparatus of claim 1 wherein said male connector is a card-edge connector, and wherein the apparatus further comprises a spacer attached to the connector and having a plurality of electrical connections therethrough, said card-edge connector being spaced apart from said printed circuit board by said spacer so that when said printed circuit board is aligned with the opening in the frame of the computer, said card-edge connector is aligned with said female expansion slot connector.

3. The apparatus of claim 1 wherein said enclosure comprises first and second enclosure halves, said first and second enclosure halves each including means for mechanically interconnecting the two said halves.

4. The apparatus of claim 3 wherein said enclosure further includes means for holding said extended portion of said printed circuit board in a fixed position relative to said enclosure halves.

5. The apparatus of claim 3 wherein said enclosure defines a plurality of connector openings, to permit access to said plurality of input/output connectors.

6. The apparatus of claim 5 wherein at least one of said first and second enclosure halves includes an enclosure opening having an area larger than the total area of said plurality of connector openings, and further includes an electromagnetic shielding plate having said plurality of connector openings formed therein, said electromagnetic shielding plate having an area larger than said area of said enclosure opening so that, when said first and second enclosure halves are mechanically interconnected, said plate and said connectors block said enclosure opening to thereby substantially prevent the emission of electromagnetic radiation through said enclosure opening.

7. The apparatus of claim 6 wherein said first and second enclosure halves are substantially identical, except that one of said enclosure halves has a solid electromagnetic shielding plate spanning its enclosure opening.

8. The apparatus of claim 1 wherein said attachment portion defines at least one slot, and wherein said means for mechanically interconnecting said enclosure with the frame of the computer includes a support member having a mating portion to engage the slot in said attachment portion, said support member having means for connection to the frame of the computer proximate to the opening, said support member being of a shape substantially spanning the opening between the frame and the attachment portion, and said support member further comprising an electromagnetic shielding material to block emission of electromagnetic radiation through said support member.

9. An apparatus for enclosing an extended portion of a printed circuit board that extends from the inside of a computer, the inside being defined by an outer frame of the computer, the printed circuit board extending through an opening in the outer frame of the computer to an area outside of the computer, comprising:

first and second enclosure halves for enclosing said extended portion of the printed circuit board, each enclosure half including an electromagnetic shielding material, said first enclosure half having a first means for enclosing one of the two major sides of said extended portion of said printed circuit board, said second enclosure half having a second means for enclosing the other of the two major sides of said extended portion in complementary relationship with said first enclosure half to thereby substantially surround said extended portion of said printed circuit board with said electromagnetic shielding material.

10. The apparatus as defined in claim 9 wherein said first and second enclosure halves are mirror images of each other.

11. The apparatus as defined in claim 9 further including means within the opening in the computer for holding said first and second enclosure halves in a fixed position.

12. The apparatus as defined in claim 11 wherein each enclosure half defines a slot, and wherein said means for holding said first and second enclosure halves in a fixed position within the computer opening includes a support member having a first and a second mating portion each of which engages a portion of the slot proximate to said first and said second enclosure halves, respectively, said support member having means for connection to the frame of the computer proximate to the opening therein.

13. The apparatus as defined in claim 9 further including a male card-edge connector connected to the printed circuit board, and further including means for electrically connecting said card-edge connector to the printed circuit board, the card-edge connector having means for engaging with a female bus connector in the computer.

14. In a personal computer having an inside and an outside, as defined by an outer frame, with an expansion connector provided on the inside, and with said outer frame and a cover providing an electromagnetic shield around the inside of said computer, an apparatus for providing a plurality of input/output connectors external to the personal computer, comprising:

a printed circuit board including means for mechanical attachment to the computer, said printed circuit board having an inside portion including those portions of the printed circuit board located inside said personal computer when said circuit board is mechanically attached to the frame and an outside portion including those portions of the printed circuit board located outside said personal computer when similarly attached, said inside portion including means for electrically connecting the printed circuit board to the expansion connector inside said personal computer, said printed circuit board also having means for electrically connecting the printed circuit board to a plurality of input/output connectors; and an enclosure having electromagnetic shielding thereon, said enclosure surrounding said outside portion of said printed circuit board to provide electromagnetic shielding of said outside portion of said printed circuit board, said enclosure having means for mechanically connecting the enclosure with the frame of said personal computer.

15. In a personal computer having an inside and an outside defined by a surrounding outer frame said frame providing an electromagnetic shield around the inside of said computer, a method of adding a plurality of input/output connectors external to the personal computer, comprising:

inserting a printed circuit board through an opening in the computer so that, when inserted, a first portion of said printed circuit board is inside the computer and a second portion of said printed circuit board is outside the computer, said second portion having a plurality of input/output connectors mounted therein;

engaging a connector inside the computer to provide electrical interconnection between said printed circuit board and the personal computer; and surrounding said second portion of said printed circuit board outside the personal computer with an electromagnetic shield to substantially block transmission of electromagnetic radiation to and from said printed circuit board.

16. The method of claim 15 wherein said surrounding step occurs before said inserting and engaging steps.

17. An apparatus for interconnecting an expansion connector in a computer with a plurality of input/output connectors, comprising:

a first connector having a means for mechanical engagement with the expansion connector, said first connector further having a plurality of electrical contacts arranged so that, when the first connector is mechanically connected with the expansion connector, the expansion connector and the first connector are electrically connected;

a printed circuit board electrically connected to said first connector so that when the first connector is electrically connected with the expansion connector, the printed circuit board is electrically connected to the expansion connector, said printed circuit board further having a sufficient length so that in the inserted position, an extended portion of the printed circuit board extends through an opening in an outer frame of the computer;

a plurality of input/output connectors electrically connected to said extended portion of the printed circuit board; and an enclosure surrounding said extended portion of the printed circuit board, said enclosure including an attachment portion having means for mechanically interconnecting said enclosure with the frame of the computer.

18. An apparatus for electrically interconnecting an expansion connector defining an expansion slot in a computer with a plurality of input/output connectors, comprising:

a printed circuit board having a first connector electrically attached thereto, said first connector sized to be selectively attached to and form an electrical connection with said expansion connector, a plurality of input/output connectors electrically connected and attached to said printed circuit board at a predetermined location outside of a housing for said computer when said first connector is attached to said expansion connector; and an enclosure surrounding said pre-determined location of said circuit board, said enclosure including means for electromagnetic shielding and means for mechanically interconnecting said enclosure with said computer housing.

19. An apparatus for electrical interconnection as described in claim 18, wherein said first connector comprises a male connector and said expansion connector comprises a female connector.

20. An apparatus for electrical interconnection as described in claim 19, wherein said male connector comprises a card-edge connector, and wherein the apparatus further comprises a spacer having a plurality of electrical connections therethrough, said card-edge connector being spaced apart from said printed circuit board by said spacer so that when said printed circuit board is aligned with the opening in the frame of the computer, said cardedge connector is aligned with said female expansion slot connector.

21. An apparatus for electrical interconnection as described in claim 18, wherein said enclosure comprises first and said second enclosure halves, said first and second enclosure halves each including means for mechanical interconnection between the two said halves.

22. An apparatus for electrical interconnection as described in claim 21, wherein said enclosure further includes means for holding said printed circuit board in a fixed position relative to said enclosure halves.

23. An apparatus for electrical interconnection as described in claim 22, wherein said enclosure defines a plurality of connector openings, to permit access to said plurality of input/output connectors.

24. An apparatus for electrical interconnection as described in claim 23, wherein at least one of said first and second enclosure halves includes an enclosure opening having an area larger than the total area of said plurality of connector openings, and further includes an electromagnetic shielding plate having said plurality of connector openings formed therein, said electromagnetic shielding plate having an area larger than said area of said enclosure opening so that, when said first and second enclosure halves are mechanically interconnected, said plate and said connectors block said enclosure opening to thereby substantially prevent the transmission of electromagnetic radiation through said enclosure opening.

25. An apparatus for electrical interconnection as described in claim 24, wherein said first and said second enclosure halves are substantially identical, except that one of said enclosure halves has a solid electromagnetic shielding plate spanning its enclosure opening.

26. An apparatus for electrical interconnection as described in claim 18, wherein said enclosure comprises an attachment portion which defines at least one slot, and wherein said means for mechanically interconnecting said enclosure with the computer housing includes a support member having a mating portion to engage the slot in said attachment portion, said support member having means for connection to the computer housing proximate to the opening, said support member being of a shape substantially spanning the opening between the housing and the attachment portion, and said support member further comprising an electromagnetic shielding material to block transmission of electromagnetic radiation through said support member.

27. The apparatus as defined in claim 13 further including a spacer having a plurality of electrical connections therethrough, said spacer being mechanically connected to the male card-edge connector and also mechanically connected to the printed circuit board in a manner such that the male card-edge connector is electrically connected to the printed circuit board, whereby the printed circuit board may be electrically connected to a female bus connector in the computer that is offset from the center of the opening.

\* \* \* \* \*